(12) United States Patent
Goel et al.

(10) Patent No.: US 6,492,917 B1
(45) Date of Patent: Dec. 10, 2002

(54) SYSTEM AND METHOD FOR IMPLEMENTATION OF THE YK LOSSLESS DATA COMPRESSION ALGORITHM USING A MODULAR COMPUTATIONAL ARCHITECTURE

(75) Inventors: Saching Goel, Bethesda, MD (US); Ashish Banerji, Gaithersburg, MD (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/999,038

(22) Filed: Oct. 31, 2001

(51) Int. Cl.[7] ................................................ H03M 7/00
(52) U.S. Cl. .......................................... 341/60; 341/50
(58) Field of Search .............................. 341/60, 50, 51; 704/231

(56) References Cited

U.S. PATENT DOCUMENTS 5,794,189 A * 8/1998 Gould ........................ 704/231
6,400,289 B1 * 6/2002 Banerji ........................ 341/60

* cited by examiner

Primary Examiner—Peguy Jeanpierre
Assistant Examiner—Joseph Lauture
(74) Attorney, Agent, or Firm—John T. Whelan; Michael Sales

(57) ABSTRACT

An improved system and method for performing lossless data compression of a data string by parsing the data string and representing the parsed characters of the data string as irreducible grammar that is efficiently updatable. The system and method are each capable of parsing the data string into a least one variable of irreducible grammar, such that each variable represents a respective plurality of data characters of the data string, and formatting each variable of irreducible grammar as a linked list data structure having at least one pointer pointing to a linked list data structure representing another variable. The system and method are each further capable of updating the irreducible grammar based on at least one character to be parsed in the input string by changing at least one pointer of at least one of the linked list data structures to point to a linked list data structure different than that to which the at least one pointer pointed prior to updating. The system and method is further capable of encoding the irreducible grammar into a string of bits. Also, the system and method can employ a separate parse module, grammar transform module, and arithmetic coder module to perform the parsing, linked list formatting, and encoding operations, respectively.

25 Claims, 3 Drawing Sheets

SYSTEM AND METHOD FOR IMPLEMENTATION OF THE YK LOSSLESS DATA COMPRESSION ALGORITHM USING A MODULAR COMPUTATIONAL ARCHITECTURE

CROSS-REFERENCE TO RELATED APPLICATIONS

Related subject matter is disclosed in U.S. patent application Ser. No. 09/712,618 of Ashish Banerji entitled "An Improved System and Method for Performing Lossless Data Compression and Decompression", filed on Nov. 14, 2000, and in U.S. patent application Ser. No. 09/711,703 of En-Hui Yang entitled "Lossless Data Compression Using Greedy Sequential Grammar Transform", filed on Nov. 14, 2000, the entire contents of both of said applications being incorporated herein by reference.

BACKGROUND OF THE INVENTION

1. Field of the Invention

The present invention relates to an improved system and method for implementing the YK lossless data compression and decompression. More particularly, the present invention relates to a system and method for performing lossless data compression and decompression using irreducible grammar whose elements are represented as linked-list data structures. The present invention proposes a three-module computational architecture for implementing the YK lossless compression and decompression algorithm, with minimal communication across modules.

2. Description of the Related Art

Data compression algorithms have been developed to reduce the size of a data string so that the data string can, for example, be more efficiently stored and transmitted. An example of a grammar-based framework for lossless data compression algorithm is described in a publication by J. C. Kieffer and E.-H. Yang entitled "Grammar based codes: A new class of universal lossless source codes," *IEEE Transactions on Information Theory*, vol. 46, no. 3, pp. 737–754, May 2000, the entire content of which is incorporated herein by reference.

As described in the Kieffer and Yang publication, to compress a data sequence, a grammar-based code first transforms the data sequence into a context-free grammar, from which the original data sequence can be fully reconstructed by performing parallel substitutions. This context-free grammar, which is a compact representation of original data, is compressed using arithmetic coding. If a grammar-based code transforms each data sequence into an irreducible context-free grammar, then the grammar-based code is universal for the class of stationary, ergodic sources.

Grammar-based codes offer a design framework in which arithmetic coding and string matching capabilities are combined in an elegant manner. Within the framework of grammar-based codes, an efficient greedy grammar transform, known as the Yang-Kieffer grammar transform, is described in a publication by E. H. Yang and J. C. Kieffer entitled "Efficient universal lossless data compression algorithms based on a greedy sequential grammar transform—Part one: Without context models," *IEEE Transactions on Information Theory*, vol. 46, pp. 755–777, May 2000, the entire content of which is incorporated herein by reference. This grammar transform sequentially constructs a sequence of irreducible context-free grammars from which the original data sequence can be recovered incrementally. The transform sequentially parses the original data in non-overlapping, variable-length phrases, and updates the grammar accordingly. Based on this grammar transform, a sequential lossless data compression, known as the YK algorithm, was developed.

The YK algorithm efficiently encodes the grammar by exploiting the structure of the grammar and using arithmetic coding to encode the sequence of parsed phrases at each step. The YK algorithm jointly optimizes, in some sense, string matching and arithmetic coding capabilities to achieve excellent compression performance on a large class of data. The following is a brief description of the major operations in the YK algorithm.

MAJOR OPERATIONS IN THE YK ALGORITHM

In defining the variables used in the following description, let A be the source alphabet with cardinality $|A|$ greater than or equal to 2. let $A^+$ denote the set of all finite strings drawn from A, let $x=x_1 x_2 K\ x_n, x=x_1 x_2 K\ x_n$ be a finite string drawn for the alphabet A that is to be compressed, and let $S=\{s_n, s_1, s_2, K\}$ be a countable set, disjoint from A. The symbol $s_0$ is called the start symbol, while elements of $S^+=\{s_1, s_2, K\}$ are called variables. For $j \geq 1$, let $S(j)=\{s_0, s_1, K, s_{j-1}\}$, and let $S^+(j)=\{s_1, K, s_{j-1}\}$. A context-free grammar G is a mapping from $S(j)$ to $(S(j) \cup A)^+$ for some $j \geq 1$. The mapping G is explicitly represented by writing each relationship $(s_i, G(s_i))$ as $s_i \rightarrow G(s_i)$, for $i<j$. G(s) is called as the production rule for This grammar is an example of an admissible grammar because one obtains a sequence from A after finitely many parallel replacements of variables in $G(s_i)$, and every variable $s_i$ ($i<j$) is replaced at least one by $G(s_i)$. The resulting sequence from A is called A-string represented by the respective variable. These A-strings are intended to represent repeated phrases in the input data string. The start symbol is special because the A-string represented by it is the complete input data string.

In addition, this grammar is an irreducible grammar because none of Reduction Rules 1 to 5 described in the second Yang and Keiffer publication referenced above can be applied to it to get a new admissible grammar. Further details of the concepts of admissible grammar and irreducible grammar can be found in that publication. An example of an irreducible grammar representing the data string abacaacabbacbabaccabaccc is shown as follows:

$s_0 \rightarrow s_3 s_1 s_1 bbs_2 bs_4 s_4 c$ $s_1 \rightarrow s_2 a$ $s_2 \rightarrow ac$ $s_3 \rightarrow ab$ $s_4 \rightarrow s_3 s_2 c$ A grammar-based framework was proposed in a publication by C. Nevill-Manning and I. Witten entitled "Compression and explanation using hierarchical grammar," *Computer Journal*, vol. 40, pp. 103–116 1997, the entire content of which is incorporated herein by reference. However, the grammar described in that publication need not satisfy the irreducibility property, and hence can be suboptimal.

The main steps of the YK algorithm are briefly summarized here. Let $x=x_1 x_2 \Lambda\ x_n$ be a sequence from A, that is to be compressed. The YK algorithm proceeds through an iterative application of the following three main operations:

1. Parsing: The parsing operation parses the sequence x sequentially into non-overlapping substrings $\{x_1, x_2 \Lambda\ x_{n_i}, K, x_{n_{i-1}+1} \Lambda\ x_{n_i}\}$ and builds sequentially an irreducible grammar $G_i$ for each $x_1 \Lambda\ x_{n_i}$, where $1 \leq i=1$, $n_1=1$, and $n_1=n$. The first substring is $x_1$, and the corresponding irreducible grammar $G_1$ consists of only one production rule $s_0 \rightarrow x_1$. At the $i^{th}$ step, suppose that the first i phrases $x_1, x_2 \Lambda\ x_{n_2}, \ldots, x_{n_{i-1}+1} \Lambda\ x_{n_i}$ have been parsed off. Suppose the variable set of the current grammar $G_i$ is $S^+(j_i)=\{s_1,\Lambda,s_{j_i-1}\}$, with $j_1=1$. The next substring $x_{n_i+1} \Lambda\ x_{n_{i+1}}$ is the longest prefix of $x_{n_i+1} \Lambda\ x_n$ that can be represented by $s_j$ if such a prefix exists in $S^+(j_i)$. If such a prefix exists, the next parsed phrase is $s_j$; otherwise, the next parsed phrase is the symbol $x_{n_i+1}$.

2. Grammar and Search-List Update: Let α denote the last symbol on the right end of $G_i(s_0)$. The parsed phrase (denoted by β) is appended to the right end of $G_i(s_0)$ to give the appended grammar $G'_1$. The appended grammar is reduced, if possible, using Reduction Rules as described, for example, in the second Yang and Keiffer publication referenced above to yield an irreducible grammar $G_{i+1}$. Define the indicator sequence $I:\{1,2,\Lambda,t\} \rightarrow \{0,1\}$ as follows: I(1)= 0, and for any i>1, I(i) is equal to 0 if $G_{i+1}$ equals $G'_i$ (i.e. reduction was not possible), and 1 otherwise (i.e. reduction was possible). It is proved in ref. 1 that the grammar $G'_i$ is reducible if and only if αβ is the only non-overlapping repeated pattern of length ≧2 in $G'_i$. To determine if the appended grammar is reducible, a search-list $L_1(\gamma)$ is maintained for all symbols in A Y $S(j_i)$, where $L_1(\gamma)$ consists of all the elements η such that the appended grammar $G'_i$ would have the pattern γη as a potential match if the next parsed phrase is η. Depending on the values of I(i+1) and I(i), there are three possible distinct cases:

Case 0: I(i+1)=0
Case 10: I(i+1)=1,I(i)=0
Case 11: I(i+1)=1,I(i)=1

Under Case 0, $G_{i+1}$ is equal to $G'_i$. Under Case 10, $G_{i+1}$ is obtained by adding a new row to $G_i$ representing the repeated phrase αβ. Under Case 11, $G_{i+1}$ is obtained by adding β to the end of the row corresponding to the last new variable. The search-lists $L_1(\gamma)$ are appropriately modified in each of the three cases. The details of the grammar and search-list update operations can be found in the publication by J. C. Kieffer and E.-H. Yang, referenced above.

3. Arithmetic Encoding: An order 1 arithmetic code is used to encode the sequence $\{I(i)\}^t_{i=1}$, and the parsed phrases β are encoded using an order 0 arithmetic encoder in an interleaved manner. The alphabet used for the order 1 arithmetic encoder is $\{0,1\}$, and the counters c(0,0), c(0,1), c(1,0), and c(1,1) are used for the order 1 frequency distribution on the alphabet. Also, for each γ∈$S^+$ Y A, two set of counters c(γ) and ĉ(γ) are used to model the frequency distribution for coding the parsed phrases β. Depending on the three cases, the coding of β uses the following alphabets and counters:

Case 0: The alphabet used for coding β is A Y $S^+(j_i)$ Y$\{\phi\}$−$L_2(\alpha)$, where $L_2(\alpha)$ is another search-list given by $L_1(\alpha) \cup \Sigma$, where Σ contains all those symbols τ such that ατ is the right side of the production rule of one of the variables in $S^+(j_i)$, and φ is the end-of-sequence symbol disjoint from A and $S(j_i)$. The counters c(γ) are used for the frequency distribution.

Case 10: The alphabet used for coding β is the search-list $L_1(\alpha)$. The counters ĉ(γ) are used for frequency distribution.

Case 11: The parsed phrase β is the only element in the search-list $L_1(\alpha)$, and hence is not coded.

When the YK encoder reaches the end of the file being compressed, it encodes the indicator 0 (corresponding to case 0), and subsequently encodes the end-of-sequence symbol φ. The counters are initialized at the start of the YK algorithm, and are updated suitably in each of the three cases. At initialization, the counters c(r,s) equal 1 for r,s=0,1, while the counters c(γ) and ĉ(γ) are given the value 1 for γ ∈ A, and 0 otherwise.

The YK decoder essentially decodes the sequence $I(i)^t_{i=1}$ using an order 1 arithmetic decoder, and based on one of the three cases discussed above, decodes the parsed phrase β. Then it updates the grammar, the search-lists, and the counters in exactly the same manner as in the YK encoder. The decoder stops when it decodes the indicator 0, followed by the end-of-sequence symbol φ. Note that the YK decoder does not perform the parsing operation. At each iteration step, the decoder translates the parsed phrase β into the corresponding A-string.

BASIC IMPLEMENTATION OF THE YK ALGORITHM

The following provides a basic implementation technique for the three major operations of the YK algorithm, based on the scheme proposed in a publication by E. H. Yang entitled "Efficient universal lossless data compression algorithms based on a greedy sequential grammar transform: Implementation and experimental results", Technical Report, Hughes Network Systems, March 1999, the entire content of which is incorporated by reference herein. First, the main data structures used by the implementation are introduced. The data structure used to represent the grammar consists of two dynamic two-dimensional arrays: A symbol array D1 and a string array D2, with D1($s_j$) and D2($s_j$), for $1 \leq j \leq j_i-1$, denoting the respective rows of D1 and D2, corresponding to variable $s_j$ at the end of the i th step.

Rows of D1 store the production rules of each variable, while rows of D2 store the A-string represented by each variable. Elements of the source alphabet A are represented by the non-negative integers $\{0,1,\Lambda,|A|-1\}$, and the variable $s_j$ is represented by the integer $|A|+j-1$ for j≧1. Rows D1($s_j$) are formed of symbols from $\{-1\} \cup A \cup \{s_0,s_1,\Lambda\}$. The special symbol −1 can be considered as a dummy placeholder that represents the deleted entries in grammar rows that result when the grammar undergoes a reduction process under Case 10 and Case 11. The placeholder is important to avoid the computational complexity of shifting big chunks of data whenever a gap is created during the reduction process of the grammar. Note that apart from the −1 integers, all other integers in the grammar data structure are non-negative. Rows D2($s_j$) are formed of symbols from A.

Elements in search-lists $L_2(\gamma)$ and its subsets $L_1(\gamma)$, for γ ∈$\{0,1,\Lambda,|A|-1,\Lambda,j_i+|A|-1\}$ are represented in form of a common quadruplet (η,m,n,ρ), where m and n represent the row and column location of the pattern γη in $G_i$, ρ is a search-list-indicator such that ρ is 1 if the element η belongs to $L_1(\gamma)$, else ρ is 0. The first element γ is referred to as the "key" of the quadruplet. Each search-list is represented by an array of such quadruplet search-list element structures, where elements of the array are arranged in increasing order of their keys.

1. Parsing: A simple grouping technique, for implementing the parsing operation is proposed in the E. H Yang publication referenced above, where the variables in the current grammar are grouped in terms of the first two letters of the A-string represented by each variable. Therefore, the search for the next parsed phrase β can be done within the group corresponding to the first two letters of the remaining input data string.

2. Grammar and Search-List Update: The indicator I(i+1) is determined by searching for the parsed phrase β in the search-list $L_1(\alpha)$, where α is the rightmost element in the top row of the grammar $G_i$. Since the elements of search-lists are arranged in increasing order, an efficient binary search can be used for efficiency. The grammar update procedure for each of the three cases is as follows:

Case 0: The integer $\beta$ is simply appended to the end of $D1(|A|)$ which represents the top row of the grammar.

Case 10: Suppose $(\beta,m,n,1)$ is the element in the search-list $L_1(\alpha)$ that identifies the matching pattern $\alpha\beta$ at the location given by row m and column n The integer $\beta$ is then searched after this location by skipping all the contiguous $-1$. Consequently, this integer $\beta$ is then replaced with a $-1$, and the integer $\alpha$ at location given by row m and column n is replaced with the integer $s_{j_i}=|A|+j_i-1$. A new row $D1(s_{j_i})$ is created consisting of the pattern $\alpha\beta$. A new row $D2(s_{j_i})$ is created to store the A-string corresponding to $D1(s_{j_i})$.

Case 11: In this case $\alpha$ is equal to $s_{j_i}=|A|+j_i-1$. Similarly, as in Case 10, the integer $\beta$ is searched after the location identified by the only element $(\beta,m,n,1)$ in the search-list $L_1(\alpha)$. Consequently, this integer $\beta$ is then replaced with the dummy $-1$. The integer $\beta$ is appended to the end of the row $D1(\alpha)$.

The search-list update procedure for each of the three cases is as follows. It is assumed that the grammar update procedure is complete before the search-list update operations are performed. When an integer i is searched in the search-list of j, it is understood that the integer i is searched amongst the first entries of the elements of the search-list of j, and this search is not performed if either i or j are null. When an integer i is added to the search-list of an integer j, it is understood that the integer i is added in the appropriate position (in increasing order) of the search-list of the integer j, provided that both i and j are not null, and the integer i is not already present as the first entry of an element of the search-list of j. When an integer i is deleted from the search-list of an integer j, it is understood that the integer i is deleted from the search-list of the integer j, provided that both i and j are not null.

Case 0: Search the first non-negative integer, call it $\sigma$, before the last element $\alpha$ of the top row of grammar $G_i$. The integer $\alpha$ is then added to the search-list of the integer $\sigma$. The corresponding row and column locations are added as the next two entries, and the search-list-indicator is set to 1. Note that since the search-list entries are maintained in their increasing order, the appropriate location in $L_1(\sigma)$ needs to be searched for introduction of the integer $\alpha$.

Case 10: Suppose $(\beta,m,n,1)$ is the element in the search-list $L_1(\alpha)$ that identifies the location of the matching pattern $\alpha\beta$ in terms of row m and column n. Search the first two non-negative integers, call them $\eta$ and $\xi$ respectively (i.e. $\eta$ is to the right of $\xi$), before the integer $\alpha$ at the location identified by this search-list element, if possible (it may not always be possible because one might already reach the beginning of the row before finding either of these integers, if it is not possible to find such integer(s), the corresponding symbols are set to null). The non-negative integer $\beta$ that followed $\alpha$ in grammar $G_i$ was already replaced by a $-1$, and $\alpha$ was replaced with the integer $s_{j_i}$, as described above. Search the first two non-negative integers, call it $\gamma$ and $\delta$ respectively (i.e. $\gamma$ is to the left of $\delta$), after this integer $s_{j_i}$, if possible. At most, four search-lists need to be updated. These correspond to the respective search-lists of the integers $\alpha$, $\beta$, $\eta$, and $s_{j_i}$. The search-list update operations on these four search-lists are described below.

Search-list of $\alpha$: The element $(\beta,m,n,1)$ in the search-list of $\alpha$ is replaced with the element $(\beta,m,n,0)$. This captures the fact that the integer $\beta$ still belongs to $L_2(\alpha)$, but not to $L_1(\alpha)$.

Search-list of $\beta$: The search-list of $\beta$ is searched for the integer $\gamma$; if $\beta=\gamma=\delta$, then the column location field of the searched search-list element is updated to correspond to the location of the phrase $\gamma\delta$ (instead of the original location of the phrase $\beta\gamma$), else this search-list element is removed.

Search-list of $\eta$: The integer $s_{j_i}$ is added to the appropriate position in the search-list of $\eta$, along with the corresponding row and column locations, and the search-list-indicator is set to 1 if the number of non-negative integers in the corresponding row is greater than 2, and 0 otherwise. The search-list of $\eta$ is searched for the element corresponding to the integer $\alpha$; if $\alpha=\eta=\xi$, the column location field of the searched search-list element is updated to correspond to the location of $\xi$, else this search-list element is removed.

Search-list of $s_{j_i}$: Unless the integer $\gamma$ is located at the rightmost position of the top row of the updated grammar, the integer $\gamma$ is added to the hitherto empty search-list of $s_{j_i}$, along with the corresponding row and column locations, and search-list-indicator is set to 1 if the corresponding row contains more than 2 non-negative integers, 0 otherwise.

Case 11: In this case, $\alpha$ equals $s_{j_i}$. Let the integers $\gamma$ and $\delta$ mean the same as in Case 10. Find the two rightmost non-negative integers in the row $D1(s_{j_i})$, call these $\theta$ and $\Theta$ respectively (i.e. $\theta$ is to the let of $\Theta$). At most, four search-lists need to be modified in this case. These correspond to the search-lists of $s_{j_i}$, $\beta$, $\Theta$, and $\theta$, as described below:

Search-list of $s_{j_i}$: Unless the integer $\gamma$ is located at the rightmost position of the top row of the updated grammar, the integer $\gamma$ is added to the hitherto empty search-list of $s_{j_i}$, along with the corresponding row and column locations, and search-list-indicator is set to 1 if the corresponding row contains more than 2 non-negative integers, and 0 otherwise.

Search-list of $\beta$: The search-list of $\beta$ is searched for the integer $\gamma$; if $\beta=\gamma=\delta$, then the column location field of the searched search-list element is updated to correspond to the location of $\gamma$, else this search-list element is removed.

Search-list of $\Theta$: The integer $\beta$ is added to the search-list of $\Theta$, along with the corresponding row and column location, and search-list-indicator is set to 1.

Search-list of $\theta$: Note that the integer $\Theta$ is already present in the search-list of $\theta$. Search for this search-list element. If the number of elements in the row $D1(s_{j_i})$ equals 2, this search-list-indicator field (which was previously 0) is set to 1.

3. Arithmetic Encoding: The parsed integer $\beta$ is arithmetic encoded to produce the compressed bit-stream. A fixed-point implementation of arithmetic coding is described in a publication by I. H. Witten, R. Neal, and J. G. Cleary entitled "Arithmetic coding for data compression," *Communications of the ACM,* Vol. 30, pp. 520–540, June 1987, the entire content of which is incorporated herein by reference. To overcome the problem of dealing with potentially large alphabet in Case 0, the arithmetic coding in this case can be efficiently performed using a recently proposed technique called multilevel arithmetic coding as described in a publication by E.-H. Yang and Y. Jia entitled "Universal lossless coding of sources with large or unbounded alphabets," Numbers, Information and Complexity (Ingo Althofer, et al, eds.), Kluwer Academic Publishers, pp. 421–442, February 2000, the entire content of which is incorporated herein by reference.

The basic idea behind multi-level arithmetic coding is to represent the alphabet using an unbalanced binary tree, where the leaves represent small subsets of the source alphabet, and $\beta$ is encoded by first coding the path needed to reach the leaf corresponding to the sub-alphabet containing $\beta$, followed by coding the index of $\beta$ in this sub-alphabet.

For coding the index of β in this sub-alphabet, the cumulative frequency array for this sub-alphabet needs to be computed. Subsequently, the frequency counters are updated accordingly.

In each iteration step, the YK decoder obtains β by decoding the compressed bit-stream to obtain the path in the multi-level alphabet tree and subsequently decoding the index in the sub-alphabet corresponding to the leaf. The frequency, grammar and search-list update operations are exactly like in the YK encoder. A parallel replacement procedure is performed on the decoded integer β to obtain the original data substring that was parsed by the encoder. Note that since no parsing is performed at the decoder, the two dimensional array D2 is not needed in the decoder.

The basic implementation described above is suitable for implementation of the YK algorithm in software. However, in hardware, the basic implementation suffers from certain drawbacks:

The parsing operation using the grouping method entails searching among potentially multiple rows of the two-dimensional array D2, and comparing each of these rows with the remaining portion of the input data stream. This tends to make the parsing operation slow.

The rows of the two-dimensional array D1 and D2 typically show a great deal of variation in size. While many rows tend to be of size 2, several other rows can be much longer. Hence, the memory requirements for such two-dimensional arrays need to be dynamically managed. Whenever the need arises for increasing the size of a row beyond what has been allocated, the whole row needs to be moved to another memory location where a sufficiently long array capable of representing the longer row exists. This is a time consuming process on hardware platforms that are not equipped with a DMA (direct memory access) engine. Moreover, if longer sizes are pre-allocated in advance for the rows of the grammar, this could lead to a lot of memory wastage.

Another problem with the two-dimensional array based representation of the grammar is that a large number of the dummy integer –1 tends to get created, and they never get removed. This leads to further memory wastage, which also causes additional memory accesses for skipping over the dummy entries to find a non-negative grammar element.

The search-list update operation requires possibly multiple searches through different search-lists in order to find an element that needs to be deleted, and also to find the appropriate position where a new search-list element needs to be inserted (to maintain the increasing order of the first entries of the elements of the search-list). Moreover, every insertion or deletion from a search-list involves forward or backward shifting of all the search-list elements that lie after the position where the insertion or deletion is made respectively.

Furthermore, the alphabets used under both Case 0 and Case 10 depend on certain search-lists, as seen in the description of the YK algorithm above. This implies that the arithmetic encoder and decoder need to access these search-list data structures in order to compute the cumulative frequency array. This makes it difficult to realize a clean separation of the two logically distinct components of the YK algorithm—(a) the grammar-related part and (b) the arithmetic coding-related part.

The parallel replacement procedure that is used by the decoder to translate the decoded integer β into the corresponding A-string can potentially require a large number of recursive operations.

An implementation scheme was proposed in the E. H. Yang publication referenced above that is suitable for efficient software implementation of the YK algorithm. However, Yang's scheme involves certain algorithmic steps that may be somewhat difficult to implement in hardware.

Accordingly, a need exists for an improved data compression and decompression system and method.

SUMMARY OF THE INVENTION

An object of the present invention is to provide an improved system and method for implementing the YK lossless data compression of a data string.

Another object of the present invention is to provide an improved system and method for performing lossless data compression of a data string by parsing the data string and representing the parsed characters of the data string as irreducible grammar that is efficiently updatable in a software or a hardware implementation.

These and other objects of the present invention are substantially achieved by providing a system and method for performing data compression of a data string. The system and method are each capable of parsing the data string into variables of an irreducible grammar, such that each variable represents a respective plurality of data characters of the data string, and formatting each element of the irreducible grammar as a linked list data structure having forward and backward pointers pointing to linked list data structures representing other grammar elements. The system and method are each further capable of updating the irreducible grammar based on at least one character to be parsed in the input string by changing at least one pointer of at least one of the linked list data structures to point to a linked list data structure representing a different element of the grammar than that to which the at least one pointer pointed prior to updating. Associated with the irreducible grammar, the system and method maintains a set of search-lists. The system and method further represent each element of these search-lists as a (different) linked-list data structure, having forward and backward pointers, possibly pointing to linked-list data structures representing other search-list elements. The two types of linked-lists are further cross-coupled in the following sense: A linked-list data structure representing a grammar element also includes a pointer, which can point to a linked-list data structure representing a search-list element; moreover, a linked-list data structure representing a search-list element also includes a pointer, which can point to a linked-list data structure representing a grammar element. The system and method is further capable of encoding the irreducible grammar into a string of bits. The system and method is further capable of decoding such a string of bits into the original data string. Furthermore, the system and method can employ a separate parse module, grammar transform module, and arithmetic coder module to perform the parsing, linked list formatting, and encoding operations, respectively.

BRIEF DESCRIPTION OF THE DRAWINGS

These and other objects and advantages of the invention will become more apparent and more readily appreciated from the following detailed description of the presently preferred exemplary embodiments of the invention taken in conjunction with the accompanying drawings, in which.

DETAILED DESCRIPTION OF THE PREFERRED EMBODIMENTS

Figure 1:
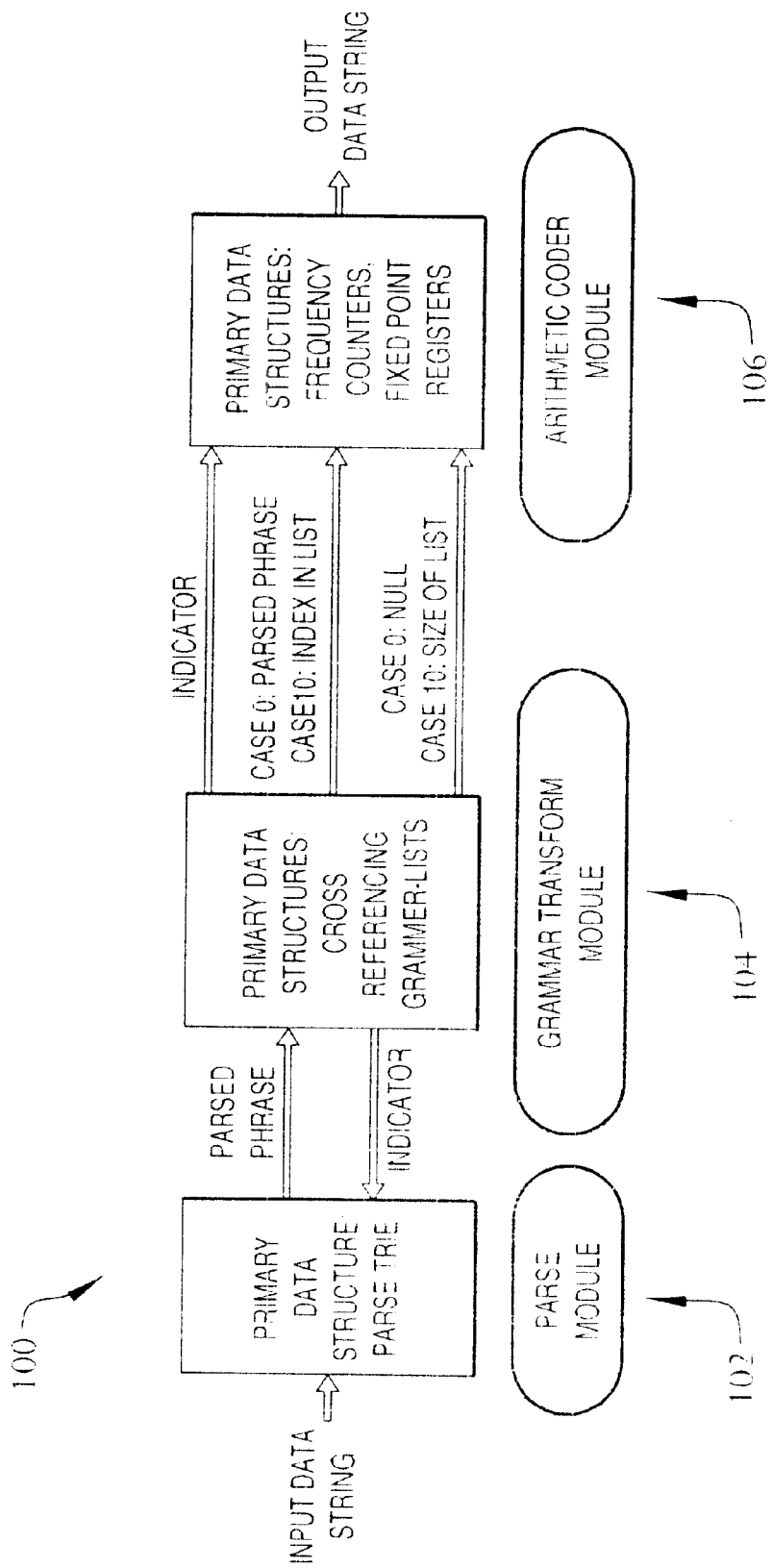
FIG. 1 is a block diagram of an example of a system for implementing the YK algorithm to perform data compression according to an embodiment of the present invention.

An embodiment of the present invention will now be described with reference to FIGS. 1–4. An example of the overall architecture for a system 100 employing an embodiment of the present invention is shown in FIG. 1. The computational architecture of the system 100 includes three distinct modules corresponding to the three basic operations of the YK algorithm, namely, a parse module 102, a grammar transform module 104 and an arithmetic coder module 106. It must be noted that although the modular architecture was designed based on motivation from hardware implementation issues, the same architecture is suitable for software implementations as well. The parse module 102 stores the parse trie data structure, performs parsing on the input (uncompressed) data string, and passes the parsed phrase to the grammar transform module 104. The grammar transform module 104 stores the cross-referencing grammar and search-list data structures, performs the grammar update and search-list update operations, and passes at most three scalar arguments to the arithmetic coder module 106. The grammar transform module 104 also passes one scalar argument, the indicator, to the parse module 102. The first argument is the indicator of the current step. The other two arguments are interpreted depending on the first argument. If the first argument is 0, the second argument is the parsed phrase, and the third argument is null (Case 0). If the first argument is 1, the second argument is the index of the parsed phrase in the search-list $L_1(\alpha)$, and the third argument is the size of $L_1(\alpha)$ (Case 10). The arithmetic coder module 106 stores the frequency counters (both for coding the indicator and the parsed phrase in Case 0) and other registers needed for arithmetic coding. It incrementally dumps bits into the output (compressed) bit-stream. The decoder architecture is analogous to that of the encoder with the notable exception of the parse module 102.

The suitability of the architecture for hardware implementation arises from the observation that the three modules 102, 104 and 106 are independent of each other except for the small number of scalar arguments that are passed across the modules. A module never needs to access the primary data structures in another module. It is also noted that various arguments flow in a single direction from the grammar transform module 104 to the arithmetic coder module 106. This allows a natural pipelining operation that lets the hardware architecture handle these two steps of iteration of the YK algorithm at the same time.

While the arithmetic coder module 106 encodes a symbol, the parse module 102 and grammar transform module 104 continue to work on future input data. The grammar transform module 104 passes the indicator to the parse module 102 as soon as it determines the indicator. It should be noted that the grammar transform module 104 determines the indicator before actually performing the grammar and search-list update operations. Hence, while the grammar transform module 104 is engaged in grammar and search-list updates, the parse module 102 can update the parse tie, if needed, and continue parsing future phrases from the input data. In fact, even before the parse module 102 learns the indicator, it can begin a provisional update of the parse trie assuming that the indicator would turn out to be 1; when it learns the new indicator it completes this update or reverts to the old trie. In this manner, the major operations in the grammar transform module 104 and parse module 102 can be performed in parallel.

The system 100 employing a data compression technique according to an embodiment of the present invention as described below has the following advantages over, for example, the implementation scheme proposed in the E. H. Yang publication referenced above:

The parsing operation used in the proposed implementation scheme is the parsing trie data structure proposed in U.S. patent application Ser. No. 09/712,618 of Ashish Banerji, referenced above. This parsing trie data structure leads to a very fast implementation of the parsing operation, and considerably reduces the gap in computational speed of the YK encoder and that of the YK decoder. This is important in real-time applications where the decoder and the encoder are constrained to work at similar speeds without causing excessive buffer overflow or underflow. The implementation of the parsing operation in the E. H. Yang publication is slower.

The proposed scheme also permits better control over the memory requirement representing the grammar and search-list data structures. The proposed scheme represents the grammar and search-list data structures using cross-referencing linked lists. These linked lists are themselves updated using a robust memory management mechanism that optimally reuses available memory whenever any element of the grammar or the search-list data structures are not needed any more.

The proposed scheme allows a faster update mechanism for search-lists, which constitutes an essential step in each iteration step of the YK algorithm. The implementation proposed in the E. H. Yang publication involves possibly multiple searches through several search-lists in each iteration step, while the proposed scheme is straightforward and does not involve any searches.

The proposed scheme allows an elegant separation of the two logically distinct parts of the YK algorithm—(i) steps relevant to the Yang-Kieffer irreducible grammar transform, and (ii) steps relevant to the arithmetic encoding and decoding of the resulting grammar. The grammar transform part is itself separated into two logically distinct parts—(i) steps relevant to parsing, and (ii) steps relevant to grammar and search-list updates. These separations not only allow a clean hardware implementation consisting of three modules—one for parsing, one for grammar transform, and one for arithmetic coding—but also allows the arithmetic coding module to be replaced by other types of adaptive entropy encoders such as move-to-front coding in alternative implementations.

The decoder needs to perform the inverse grammar transform in order to obtain the original decompressed data from the decoded grammar. The proposed scheme leads to a decoder implementation that replaces the parallel replacement procedure proposed in the two Yang and Keiffer publications referenced above, with a much simpler and faster method for this inverse transformation. The proposed scheme incrementally retrieves the decompressed data from the partial data already decoded before the current iteration.

The proposed data compression scheme according to an embodiment of the present invention that lends itself to efficient implementation of the YK algorithm in hardware and software will now be described. As shown in FIG. 1, the proposed hardware architecture of the system 100 includes three independent modules 102, 104 and 106 for each of the three main operations in the YK algorithm, with only a minimal communication across these modules. For each of these modules, the data structures and implementation details can be described as follows.

1. Parsing: A parsing trie data structure specifically designed for the YK algorithm is used for implementing the parsing operation. The details of this trie data structure and the implementation of the parsing operation using this data structure is described in U.S. patent application Ser. No. 09/712,618, referenced above. The parse trie essentially stores the A-strings corresponding to each variable in the grammar in the form of a path in the trie, when the path is traversed from the root of the trie. Nodes in the parse trie have the following form: {trie_sym, child, sibling, gmr_row}, where trie_sym stores the integer representing a source symbol in the A-string, child is a pointer to the first child of the current node (it stores null if the current node has no more children), sibling is a pointer to the next child of the parent of the current node (it stores null if the current node is the last child of its parent), and gmr_row stores the variable, if any, corresponding to the complete A-string that the path from the root to the current node represents (nodes that do not represent complete A-strings corresponding to any variable in the grammar store a null value). The parsing trie data structure needs to add the A-string corresponding to the new variable whenever the grammar transform module determines the indicator to be 1.

Figure 2:
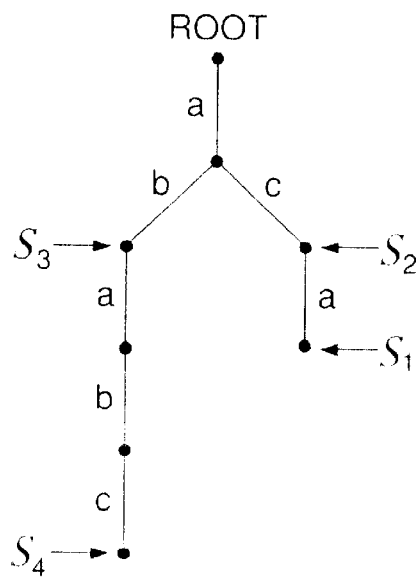
FIG. 2 is an example of a parse trie data structure.

An illustration of such a parsing trie is shown in FIG. 2 corresponding to the irreducible grammar representing the data string abacaacabbacbabaccabaccc discussed in the Background section above, which is repeated here as $s_0 \to s_3 s_1 s_1 bbs_2 bs_4 s_4 c$
$s_1 \to s_2 a$
follows:
$s_2 \to ac$
$s_3 \to ab$
$s_4 \to s_3 s_2 c$ An example of the use of this data structure for parsing will now be described using the parsing trie in FIG. 2. Suppose the future portion of the input data sequence is abbbcc . . . , then the next parsed phrase is the variable $s_3$. Similarly, if the future portion of the input data sequence is aabbb . . . , then the next parsed phrase is the symbol a. The parsing operation as implemented using the parsing trie data structure is direct, since the parsed phrase is essentially read off the parsing trie by traversing the trie using the remaining portion of the input data string.

In the basic implementation, the main data structure that was used to perform the parsing operation is the dynamically allocated two-dimensional array D2, whose rows stores the A-strings corresponding to each variable in the grammar. Use of the parse trie data structure obviates the need for such a two-dimensional array. Indeed, the parse trie inherently stores the A-strings in its paths. The use of the parse trie data structure leads to faster parsing because multiple searching for the parsed phrase among rows of D2 is replaced with a direct reading off of the parsed phrase from the parse trie.

2. Grammar and Search-List Update: Instead of using a dynamically allocated two-dimensional array to represent the grammar and arrays of quadruplets to represent the search-lists, this invention proposes the use of cross-referencing linked-list data structures for representing the grammar and the search-lists. In the modified implementation, the only search-lists that are used are the $L_1(\cdot)$, and the concept of search-lists $L_2(\cdot)$ is not used. The grammar is represented using a linked-list for each row, where each element in the linked list has the following form: {gmr_sym,right,left,list_ptr}, while the search-list of each symbol is represented using a linked-list, where each element in the linked-list has the following form: {list_sym, fwd,bck,gmr_ptr}.

The gmr_sym field stores the key value of the grammar element, right stores the pointer to the next element in the grammar row (or null if the current element is the rightmost element in the row), left stores the pointer to the previous element in the grammar row (or null if the current element is the leftmost element in the row). The fourth field list_ptr is a pointer to that search-list element, if any, which stores the current grammar location as a potential match.

The list_sym field is an integer corresponding to the value of the search-list element, fwd stores the pointer to the next entry in the search-list, bck stores the pointer to the previous entry in the search-list. The fourth member gmr_ptr stores the pointer to that element of a grammar data structure that corresponds to the potential matching phrase indicated by the current search-list element. Unlike in the basic implementation, elements of a search-list are not required to be arranged in increasing order of the first entry. Rather, a new element is added to the end of a search-list whenever necessary.

Figure 3:
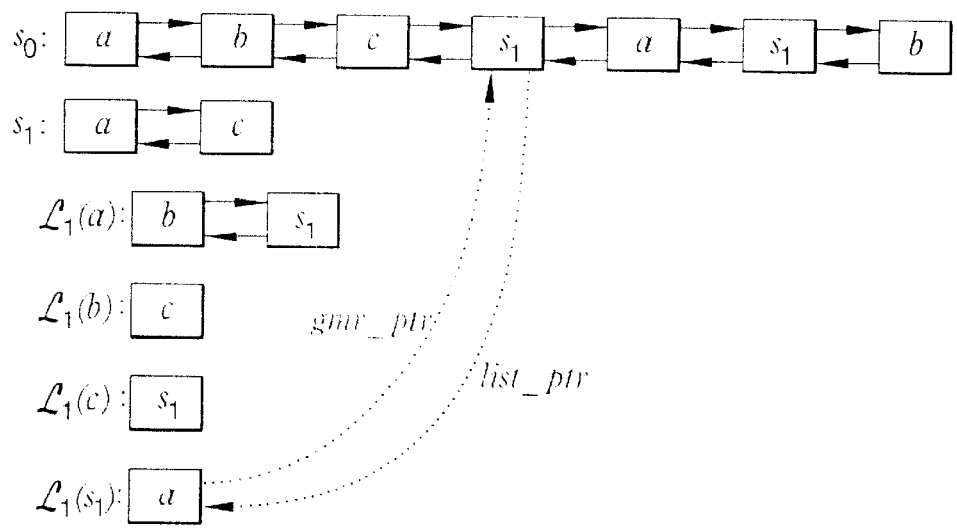
FIG. 3 is an example of grammar and search-list data structures employed for data compression in accordance with an embodiment of the present invention.
Figure 4:
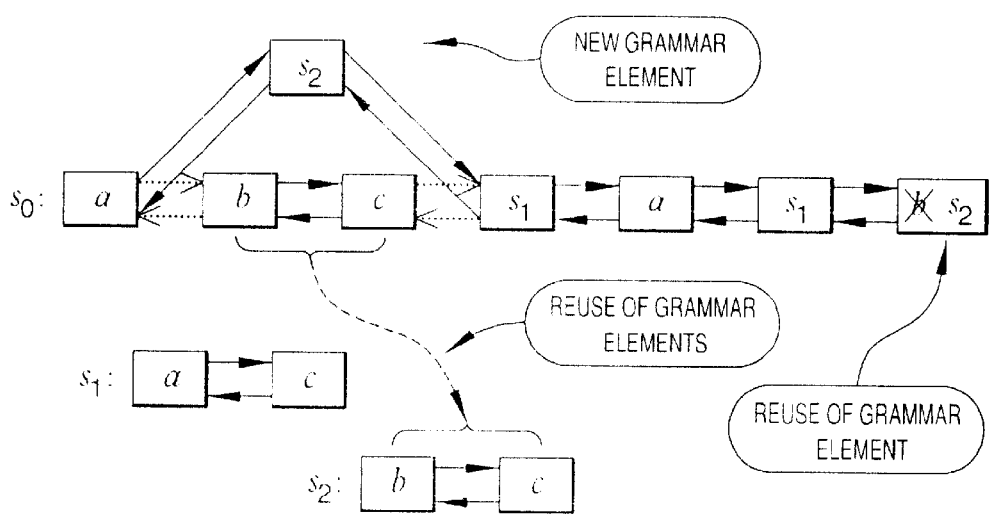
FIG. 4 is an example of a grammar and search-list update procedure using the linked-list data structure shown in FIG. 3 in accordance with an embodiment of the present invention.

Note that the data structures used for representing the grammar and the search-lists cross-reference each other. On one hand, each grammar element contains a pointer to the search-list element that stores the current grammar location as a potential match, and on the other hand, each search-list element contains a pointer to the grammar element that corresponds to the location of the potential match indicated by this search-list element. An illustration of the cross-referenced concept of the grammar and search-list data structures is shown in FIG. 3.

The manner in which the grammar and search-list update operations are implemented using the proposed data structures will now be discussed. These operations proceed along the steps outlined in the subsection on basic implementation of the YK algorithm, with the steps now being performed on linked lists rather than on arrays. The modifications that arise due to the use of the new data structures are described below:

Determination of the indicator: The search-list $L_1(\alpha)$ is first searched for the presence of $\beta$. Unlike in the basic implementation, where a binary search could be used because the search-list elements were arranged in increasing order, in this case a linear search has to be used. However, since the sizes of search-lists are usually very small, the search complexity is similar to that in the basic implementation. The indicator is passed to the parse module that updates the parse trie if the indicator is 1.

Grammar updates: When the grammar rows are updated, there is no need for a dummy −1 symbol to be introduced as a placeholder whenever an element is deleted from a row of the grammar. This is possible because unlike arrays, linked lists allow easy insertion without the need to move any other elements. In addition, an elegant memory management procedure is used that allows a neat control over the memory usage of the grammar through reuse of memory. A pool of grammar elements is allocated at the initialization of the YK algorithm, and a fresh grammar element is borrowed from this pool whenever a new element is needed for adding to a row of the grammar. The neat memory management procedure is based upon the observation that under Case 0 and Case 10, the total number of elements in grammar $G_{i+1}$ is exactly one more than that in grammar $G_i$, while under Case 11, the total number of elements in grammar $G_{i+1}$ is exactly the same as in grammar $G_i$. This implies that at most one fresh element needs to be borrowed from the pool of the grammar elements in each iteration step of the YK algorithm. This is elaborated for each of the following three cases:

Case 0: Grammar $G_{i+1}$ is obtained by appending the new parsed phrase β to the end of the top row of grammar $G_i$. This is a net addition of one extra element, and is performed by borrowing a fresh element from the pool of grammar elements.

Case 10: Grammar $G_{i+1}$ is obtained by adding a new row of size 2 (with entries α followed by β), replacing the rightmost element in the top row (originally α) to $s_{j_i}$, and deleting the element β at the location of the match; this yields a net increase of 1 in the total number of elements in the grammar. The rightmost element in the top row is changed to $s_{j_i}$. The phrase αβ that is present in the match location in grammar $G_i$ is disconnected from the original row and moved to the new row of the grammar. And at the location of the match, the element $s_{j_i}$ is inserted by borrowing a fresh new element from the pool of grammar elements. FIG. 9.4 illustrates this grammar update operation.

Case 11: Grammar $C_{i+1}$ is obtained by deleting the element β at the location of the match, and reusing this element to append at the end of the last row of the grammar. Hence the size of the grammar does not change.

Search-List updates: The search-list updates proceed along similar steps as in the basic implementation. The important differences that arise due to the use of linked-list data structures are outlined below. It is noted that in the basic implementation, under Case 10, the element β is simply removed from the search-list $L_1(α)$, and it continues to belong to $L_2(α)$. However, in the proposed implementation, since the search-lists $L_2(•)$ are no longer used, under Case 10, the element β is removed from $L_1(α)$.

Also, in the basic implementation, it is necessary to perform searches through search-lists in order to find the location of element that needs to be deleted. However, in the proposed implementation, no such search is required, because whenever a certain element needs to be deleted, the location of this element is directly determined using the list_ptr that points to this exact element in the appropriate search-list.

Furthermore, in the basic implementation, it was necessary to perform searches through search-lists in order to find the appropriate position where a new element needs to be inserted in order to maintain the increasing order of the search-list elements. However, in the proposed implementation, no such search is required, because new elements are simply appended to the end of the appropriate search-list, because the requirement for maintaining the increasing order of elements no longer exists.

The search-list update operation also uses a memory management procedure to control the memory requirement of the search-list data structures. A pool of search-list elements is initially allocated like in the case of the grammar. However, unlike in the case of grammar, the total size of search-lists does not necessarily increase monotonically with the number of iterations of the YK algorithm. Hence, the search-list memory management is more complex than in the case of grammar, because it has to keep track of memory elements that are returned to the pool whenever a net reduction in the total size of the search-list data structures takes place.

It is further noted that the proposed cross-referencing data structures restrict the number of searches through search-lists to one at every iteration step. This search is required to determine the indicator. However, no additional searches are required for search-list updates.

Arithmetic Encoding: Like in the basic implementation, the indicator sequence and the parsed phrases β are encoded in an interleaved manner, using an order one arithmetic encoder for the indicators, and an order zero arithmetic encoder for the parsed phrases. The encoding of the indicator sequence remains unchanged in the new implementation. However, the encoding of the parsed phrases is modified in order to allow a simple separation of the two logically distinct operations—grammar transform and grammar encoding. Instead of maintaining two sets of frequency counters for each symbol, only one set of cumulative frequency counters $C(γ)$ for each $γ∈S^+∪A$, is used. For each of the three cases, the arithmetic encoding then progresses according to the following steps:

Case 0: The alphabet used for coding β is $A∪S^+(j_i)∪\{φ\}$. The cumulative frequency counters $C(•)$ are used for performing the arithmetic coding operation.

Case 10: The alphabet used for coding β is the set $\{0,1,A,|L_1(α)|-1\}$. A uniform frequency distribution (i.e. all frequency counts equal to 1) is used for modeling the statistics of this alphabet.

Case 11: β is not coded in this case, like in the basic implementation.

Note that the Case 0 alphabet can be larger than the optimum alphabet that is used in the original YK algorithm. However, in practical applications, the set $A∪S^+(j_i)∪\{φ\}$ is usually much larger than the search-lists $L_2(•)$, and therefore the sub-optimum choice for the alphabet has a negligible effect on compression performance.

In the basic implementation, the frequency counters $c(•)$ are anyway converted to cumulative frequency counts for arithmetic coding. This process requires as many additions as the number of symbols in the alphabet used. And this proceeds sequentially from the largest symbol to the smallest, because computation of $C(•)$ for a symbol requires the knowledge of $C(•)$ for all the symbols greater than it. In the update step, only one frequency counter, corresponding to the parsed phrase β, is incremented. On the other hand, in the proposed architecture, the cumulative frequency counters are directly available for arithmetic encoding. However, the updating of the cumulative frequency counters is done by incrementing the counters corresponding to all the symbols less than β by a constant. Hence, these operations can all be performed in parallel, unlike in the basic implementation. Moreover, the number of such additions is on an average only half the size of the alphabet used.

The high coding efficiency in Case 10 arises from the small size of the alphabet used. It turns out that the frequency counters $∃(•)$ that are used in the basic implementation contribute little extra to coding efficiency. Hence, the new implementation uses a uniform frequency distribution over the already small alphabet. This drastically reduces the implementation complexity of the arithmetic coding operation. Note that because the frequency distribution is uniform, the arithmetic encoder does not need direct access to the search-list data structures. It only needs knowledge of the size of the search-list of α, and the index of the parsed phrase in this search-list. An ad-hoc justification for using a uniform frequency distribution follows next.

For Case 10, the basic implementation maintains a set of frequency counters $∃(•)$ that counts the number of times each symbol in $S^+∪A$ is parsed, conditioned on the event that the resulting case is Case 10. These frequency counts can be further refined if one uses the heuristic that the counts should not only be conditioned on Case 10, but also on the last parsed phrase α. Seemingly this heuristic would result in a large number of different sets of frequency counters, $\{d_η(γ):γ∈S^+∪A\}$, with a set for each symbol η in $S^+∪A$. At start of compression, for each η, the frequency counters in the corresponding set would be initialized to 1 for each symbol in A, and 0 for each symbol in $S^+$, and frequency counters for a symbol in $S^+$ would be initialized to 1 whenever a variable corresponding to the symbol is first created in the grammar.

In addition, suppose a parsed phrase β leads to Case 10, leading to the creation of a new variable αβ. This variable potentially gets further updated if there is a sequence of Case 11's following this Case 10. In many naturally occurring data, the phrase represented by this variable would repeat in full later in the data. Therefore, the two phrases α and β would likely never be parsed consecutively, because the whole phrase represented by the above variable would be parsed at once. Therefore, whenever there is a possibility of updating the frequency counter for β, the updated frequency counter would not be useful in the future. Hence, essentially only those frequency counters which have never been updated would likely figure in arithmetic encoding, and this corresponds to a uniform frequency distribution.

The above argument could possibly break down if there is a nested sequence of variables where the production rule of a variable is a subset of the previous variable in the sequence. However, in practical situations, such nested sequences are rarely very long that would drastically make the frequency distribution non-uniform.

Like in the basic implementation, a multi-level arithmetic coding approach, as described, for example, in the E. H. Yang and Y. Jia publication referenced above, can be used for Case 0 in proposed architecture for reducing the size of alphabets. In the basic implementation, the arithmetic encoder needs to have access to the search-list data structures, and this makes it difficult to decouple the arithmetic encoding operation from the rest of the YK algorithm. However, these operations are naturally decoupled in the proposed implementation, and the computational benefits due to decoupling far outweighs the small performance loss due to the use of sub-optimal alphabet in Case 0 and Case 10.

The implementation of the three main operations in the encoder was described above. Implementation of the YK decoder involves exactly the same grammar and search-list update steps, and an arithmetic decoder analogous to the arithmetic encoder described above. The parse operation does not exist in the decoder. However, the decoder has to do one additional step—apply the inverse grammar transform on the decoded irreducible grammar to obtain a copy of the input data string. This is achieved by converting the decoded symbol β into the A-string represented by β (which should be the same as the substring parsed by the encoder from the input data string). One way to do this is using the parallel replacement procedure. This procedure replaces in parallel every occurrence of variables in the production rule of β with their respective production rules. This is recursively repeated until the desired A-string is obtained. It is a theoretical fact that this recursive procedure needs at most finitely many steps, as described in the first Keiffer and Yang publication referenced above. However, for large data sets, this finite number of steps tends to be large, and the parallel replacement procedure ends up being computationally intensive.

The proposed hardware implementation uses a far simpler procedure by exploiting the fact that the A-string represented by β is a sub-string of the data that has been decoded so far; it just needs to keep track of the location and the length of this sub-string. Therefore, the decoder maintains a decoded data pointer $p(s)$ for each $s \in S^+$, and a length $l(s)$ for each $s \in S^+ \cup A$. The length for each $s \in A$ is set to the constant 1. At initialization of the YK algorithm, these values are respectively set to null and 0 for each $s \in S^+$. These values are updated under Case 10 and Case 11, as follows.

Case 10: The new variable s that is created in this step has the production rule αβ. Let $p_c$ denote the current position at the end of data string that was decoded in the last iteration. The update steps are:

$$p(s) = p_c - l(\alpha)$$

$$l(s) = l(\alpha) + l(\beta)$$

The first equation sets the decoded data pointer for variable s by going back the length of α from the end of the currently decoded data string, because that is the position from where α was parsed in the previous iteration step of the corresponding encoder. And since the variable s has the production rule given by αβ, the length of variable s is set to sum of lengths of α and β.

Case 11: The update step required as: $l(s) = l(s) + l(\beta)$

Since the production rule of variable s is updated by adding β at the right end, the length of variable s is incremented by the length of β. Under Case 11, note that only the right end of the production rule of a variable is modified, and so the decoded data pointer remains unchanged. Therefore, the decoded data pointer needs to be updated only under Case 10.

The embodiments described above can be employed in any system that uses lossless data compression. Efficient hardware implementation of the YK algorithm would lead to significant gains in computational speed. In particular, the performance of a satellite communications system can benefit from the fast and powerful compression of hardware YK implementation for the compression of IP datagrams. Similarly, hardware implementation of the YK algorithm would be applicable for fast and efficient compression of data in various Internet and Web-based networks and systems.

Although only a few exemplary embodiments of the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:

1. A data compression method, comprising:

parsing a data string into a least one variable of an irreducible grammar or original source alphabet symbol, where each said variable represents at least one respective data character of said data string; and performing at least one of the following steps:

formatting each element of each row of said irreducible grammar as a grammar-linked list data structure, having at least one pointer adapted to point to said linked list data structures representing other said elements; and formatting each element of search-lists associated with said irreducible grammar as a search linked-list data structure having at least one pointer adapted to point to said linked list data structures representing other said elements.

2. A data compression method as claimed in claim 1, wherein:

said performing step performs the first of said formatting steps.

3. A data compression method as claimed in claim 1, wherein:

said performing step performs the second of said formatting steps.

4. A data compression method as claimed in claim 1, wherein:

said performing step performs both of said formatting steps.

5. A data compression method as claimed in claim 1, wherein:

one of said pointers of said grammar linked list data structure is adapted to point to a said grammar linked list data structure at a location previous to said grammar linked list data structure in said linked list, and another of said pointers of said at least one grammar linked list data structure is adapted to point to a said grammar linked list data structure at a location subsequent to said grammar linked list data structure in said linked list.

6. A data compression method as claimed in claim 1, wherein:

one of said pointers of said search-list linked list data structure is adapted to point to a said search-list linked list data structure at a location previous to said search-list linked list data structure in said linked list, and another of said pointers of said at least one search-list linked list data structure is adapted to point to a said search-list linked list data structure at a location subsequent to said search-list linked list data structure in said linked list.

7. A data compression method as claimed in claim 1, further comprising:

updating said irreducible grammar based on at least one character to be parsed in the input string by changing at least one pointer of at least one of said grammar linked list data structures to point to a said grammar linked list data structure different than that to which said at least one pointer pointed prior to updating.

8. A data compression method as claimed in claim 1, further comprising:

updating said search-lists based on at least one character to be parsed in the input string by changing at least one pointer of at least one of said search-list linked list data structures to point to a said search-list linked list data structure different than that to which said at least one pointer pointed prior to updating.

9. A data compression method as claimed in claim 1, wherein:

each said grammar linked list data structure includes an additional pointer, adapted to point to a pointing to a search-list linked list data structure or a null data structure.

10. A data compression method as claimed in claim 1, wherein:

each said search-list linked list data structure includes an additional pointer, adapted to pointing to a grammar linked list data structure or a null data structure.

11. A data compression method as claimed in claim 1, further comprising:

encoding said irreducible grammar into a string of bits.

12. A system for performing data compression, comprising:

a parser, adapted to parse a data string into one variable of irreducible grammar or one source alphabet symbol, where each said variable represents a respective plurality of data characters of said data string; and a grammar transformer, adapted to format each element of said irreducible grammar as a linked list data structure having at least one pointer adapted to point to at least one other linked list data structure representing another said element, based on said variable or said symbol produced by said parser.

13. A system as claimed in claim 12, wherein:

said grammar transformer is further adapted to update said irreducible grammar based on at least one character to be parsed in the input string by changing at least one pointer of at least one of said grammar linked list data structures to point to a said grammar linked list data structure different than that to which said at least one pointer pointed prior to updating.

14. A system as claimed in claim 12, wherein:

said grammar transformer is further adapted to update said search-lists based on at least one character to be parsed in the input string by changing at least one pointer of at least one of said search-list linked list data structures to point to a said search-list linked list data structure different than that to which said at least one pointer pointed prior to updating.

15. A system as claimed in claim 13, wherein:

said grammar transformer is further adapted to minimize the use of memory elements by reusing grammar linked list data structure elements in a way that no more than one additional grammar linked list data structure element is added to the grammar during a grammar update process.

16. A system as claimed in claim 14, wherein:

said grammar transformer is adapted to minimize the use of memory elements by reusing search-list linked list data structure elements.

17. A system as claimed in claim 12, wherein:

at least one said linked list data structure includes said at least one pointers, each adapted to point to a respective other of said data structures.

18. A system as claimed in claim 17, wherein:

one of said pointers of said at least one linked list data structure is adapted to point to a said data structure at a location previous to said at least one linked list data structure in said search-list, and another of said plurality of pointers of said at least one linked list data structure is adapted to point to a said data structure at a location subsequent to said at least one linked list data structure in said search-list.

19. A system as claimed in claim 12, wherein:

said parser and grammar transformer are configured as a separate parser module and grammar transform module, respectively.

20. A system as claimed in claim 19, wherein:

said parser module and said grammar transform module are implemented in a parallel fashion.

21. A system as claimed in claim 12, further comprising:

an entropy encoder, adapted to encode said parsed variables and symbols into a string of bits.

22. A system as claimed in claim 21, wherein:

said parser, grammar transformer and encoder are configured as a separate parser module, a grammar transform module and an entropy encoder module, respectively.

23. A system as claimed in claim 21, wherein:

said entropy encoder module includes an arithmetic encoder.

24. A system as claimed in claim 23, wherein:

the alphabet used by said arithmetic coder while encoding a said parsed variable or symbol is either independent of said search-list or depends on a size of said search-lists and position of the variable or symbol to be encoded in said search-list.

25. A system as claimed in claim 21, wherein:

said grammar transform module and said entropy encoder are implemented in a pipelined structure.

* * * * *